United States Patent
Lee et al.

(10) Patent No.: US 8,330,334 B2
(45) Date of Patent: Dec. 11, 2012

(54) APPARATUS EMPLOYING PIEZOELECTRIC ENERGY HARVESTER CAPABLE OF GENERATING VOLTAGE TO DRIVE POWER CONDITIONING CIRCUIT AND METHOD OF MANUFACTURING THE SAME

(75) Inventors: Sang Kyun Lee, Gwangju (KR); Seung Eon Moon, Daejeon (KR); Yil Suk Yang, Daejeon (KR); Kang Ho Park, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 390 days.

(21) Appl. No.: 12/652,177

(22) Filed: Jan. 5, 2010

(65) Prior Publication Data

US 2011/0057458 A1 Mar. 10, 2011

(30) Foreign Application Priority Data

Sep. 8, 2009 (KR) ........................ 10-2009-0084384

(51) Int. Cl.
*H01L 41/08* (2006.01)
*H01L 41/12* (2006.01)

(52) U.S. Cl. ......................................... 310/339; 310/26

(58) Field of Classification Search .................. 310/339, 310/26
See application file for complete search history.

(56) References Cited

U.S. PATENT DOCUMENTS

| | | | | |
|---|---|---|---|---|
| 6,809,516 | B1 * | 10/2004 | Li et al. | 324/260 |
| 6,984,902 | B1 * | 1/2006 | Huang et al. | 310/26 |
| 7,521,842 | B2 * | 4/2009 | Tucker et al. | 310/339 |
| 7,667,376 | B2 * | 2/2010 | Schmidt | 310/339 |
| 7,800,278 | B2 * | 9/2010 | Ujihara et al. | 310/306 |
| 7,804,229 | B2 * | 9/2010 | Tucker et al. | 310/339 |
| 7,808,159 | B2 * | 10/2010 | Tucker et al. | 310/339 |
| 2005/0194863 | A1 | 9/2005 | Viehland et al. | |
| 2007/0257634 | A1 | 11/2007 | Leschin et al. | |
| 2008/0277941 | A1 * | 11/2008 | Bowles et al. | 290/54 |
| 2011/0074162 | A1 * | 3/2011 | Cottone et al. | 290/1 R |

FOREIGN PATENT DOCUMENTS

| | | |
|---|---|---|
| JP | 2006-098332 | 4/2006 |
| JP | 2006098332 A * | 4/2006 |
| KR | 1020090031369 A | 3/2009 |
| WO | WO 2007110943 A1 * | 10/2007 |

OTHER PUBLICATIONS

Lionel Petit et al., "Ultrasonic wireless health monitoring," Health Monitoring and Smart Nondestructive Evaluation of Structural and Biological Systems V, 2006, pp. 617713-1-617713-12, vol. 6177.

Geffrey K. Ottman et al., "Adaptive Piezoelectric Energy Harvesting Circuit for Wireless Remote Power Supply," IEEE Transactions on Power Electronics, Sep. 2002, pp. 669-676, vol. 17, No. 5, IEEE.

\* cited by examiner

*Primary Examiner* — Jaydi San Martin

(57) ABSTRACT

Provided are a piezoelectric energy harvester and a method of manufacturing the same. The piezoelectric energy harvester is configured to obtain primary voltage from a piezoelectric layer vibrated to generate voltage and secondary voltage from a magnetostrictive layer vibrated to induce a change in magnetic field and a coil surrounding the magnetostrictive layer. Thus, it is possible to obtain sufficient voltage to drive a power conditioning circuit (PCC).

6 Claims, 3 Drawing Sheets

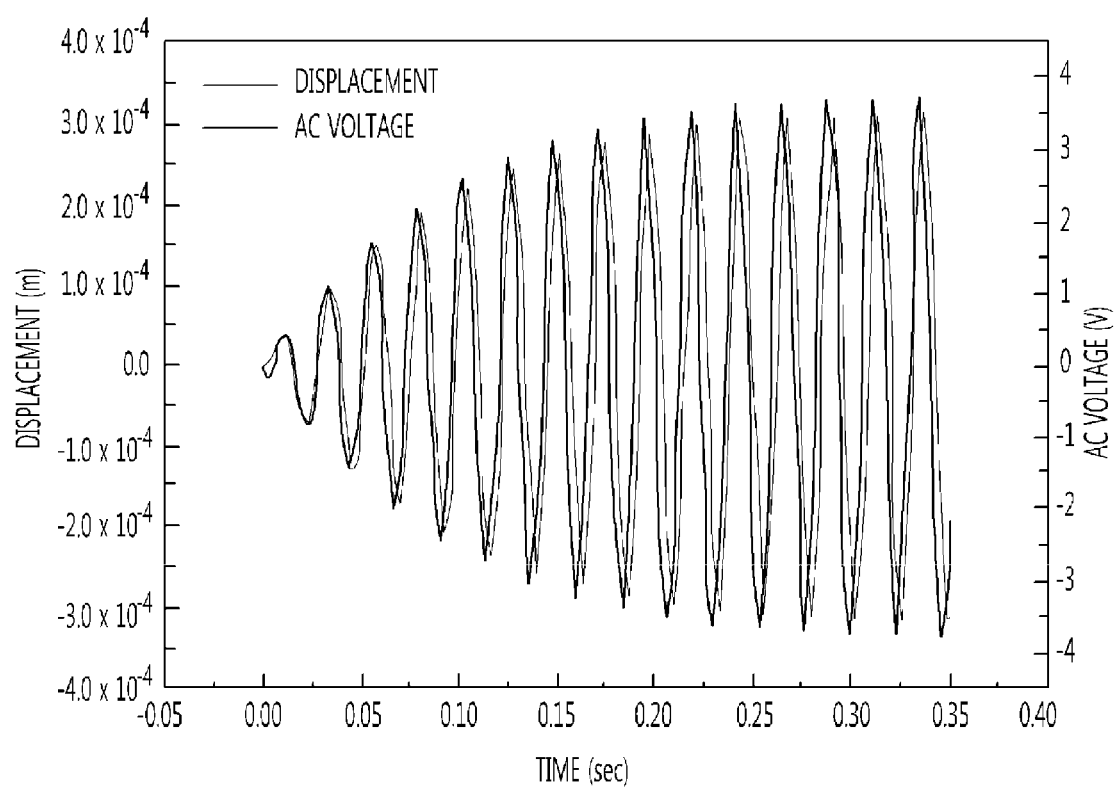

APPARATUS EMPLOYING PIEZOELECTRIC ENERGY HARVESTER CAPABLE OF GENERATING VOLTAGE TO DRIVE POWER CONDITIONING CIRCUIT AND METHOD OF MANUFACTURING THE SAME

CROSS-REFERENCE TO RELATED APPLICATION

This application claims priority to and the benefit of Korean Patent Application No. 10-2009-0084384, filed Sep. 8, 2009, the disclosure of which is incorporated herein by reference in its entirety.

BACKGROUND

1. Field of the Invention

The present invention relates to a piezoelectric energy harvester and a method of manufacturing the same, and more particularly to a piezoelectric energy harvester capable of obtaining sufficient voltage to drive a power conditioning circuit (PCC) without affecting characteristics thereof and a method of manufacturing the same.

2. Discussion of Related Art

Piezoelectric energy harvesters cause a piezoelectric layer to bend, contract, stretch, etc., using vibration, sound waves, ultrasonic waves, etc., thereby generating voltage due to the piezoelectric effect. According to a structure in which a piezoelectric layer is stacked, piezoelectric energy harvesters are classified into various types such as unimorph and bimorph. In general, the bimorph-type piezoelectric energy harvesters in which piezoelectric layers are stacked on the both surfaces of a shim are frequently used.

Voltage generated by such a piezoelectric energy harvester is used to drive an external circuit (a microcontroller unit (MCU), sensor, and radio frequency (RF) transceiver) or a switch of a PCC, which will be described in detail below.

FIGS. 1 and 2 illustrate a conventional piezoelectric energy harvester connected with a PCC and a charger (a electrolytic capacitor, ultra-capacitor or battery).

Referring to FIGS. 1 and 2, when vibration is applied to a conventional piezoelectric energy harvester 100, voltage is generated from piezoelectric layers 130a and 130b formed on both surfaces of a shim 110.

When voltage is generated from the piezoelectric energy harvester 100, a change in voltage is detected by a voltage detector in a PCC 200, and switches S1 and S2 are driven.

However, in these structures, the voltage detector may affect operation of the piezoelectric energy harvester 100 and cause an operating frequency changes, electrical damping, output power loss, etc. It is due to of coupling of mechanics and electronics. Thus, the structures must be designed in consideration of these problems.

To solve these problems, a structure in which a displacement sensor is connected to the exterior of a piezoelectric energy harvester and senses displacement of the piezoelectric energy harvester to drive a switch of a PCC has been suggested.

However, this structure has problems in that a displacement sensor is necessary, the displacement sensor may affect amplitude variation of the piezoelectric energy harvester and cause mechanical damping variation, and the size of the piezoelectric energy harvester increases. Also, when the displacement sensor is contacted with the piezoelectric energy harvester, physical impact may occur on the piezoelectric energy harvester.

SUMMARY OF THE INVENTION

The present invention is directed to a piezoelectric energy harvester of a simple structure capable of obtaining voltage required to drive a power conditioning circuit (PCC) without affecting characteristics thereof.

One aspect of the present invention provides a piezoelectric energy harvester including: a piezoelectric layer vibrated to generate a first voltage, and formed on at least one of upper and lower surfaces of a shim; a magnetostrictive layer vibrated to induce a change in magnetic field, and formed on the piezoelectric layer; and a coil surrounding the piezoelectric layer and the magnetostrictive layer. Here, when the magnetostrictive layer is vibrated and induces a change in magnetic field, current flows through the coil, and a second voltage is generated.

Another aspect of the present invention provides a method of manufacturing a piezoelectric energy harvester including: forming a piezoelectric layer vibrated to generate a first voltage on at least one of upper and lower surfaces of a shim; forming a magnetostrictive layer vibrated to induce a change in magnetic field on the piezoelectric layer; and surrounding the piezoelectric layer and the magnetostrictive layer with a coil.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which:

FIGS. 4A and 4B are graphs illustrating characteristics of displacement and output voltage of a piezoelectric energy harvester according to an exemplary embodiment of the present invention.

DETAILED DESCRIPTION OF EXEMPLARY EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention.

Figure 1:
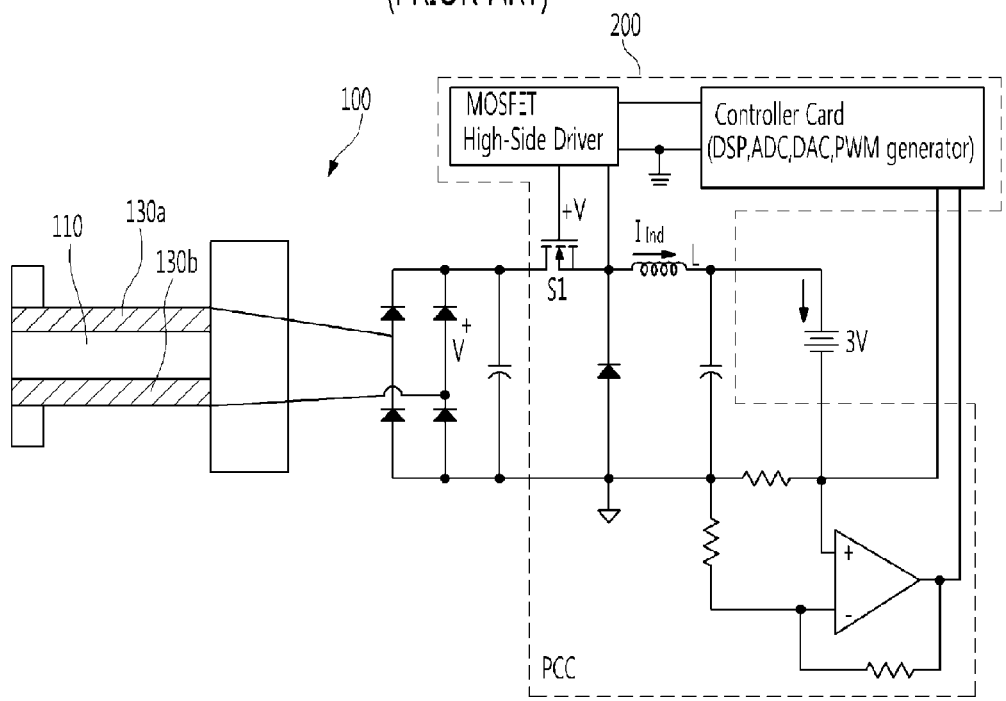
FIGS. 1 and 2 illustrate a conventional piezoelectric energy harvester connected with a power conditioning circuit (PCC)
Figure 2:
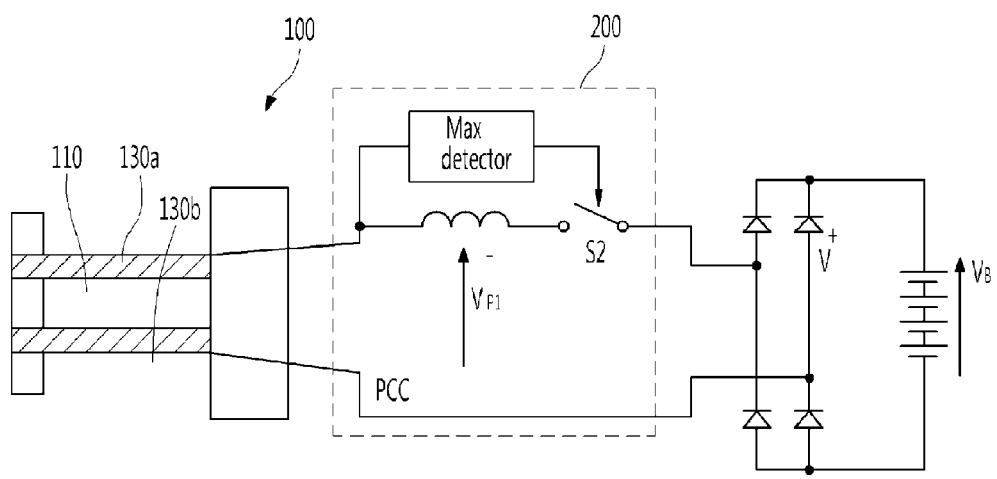
Figure 3:
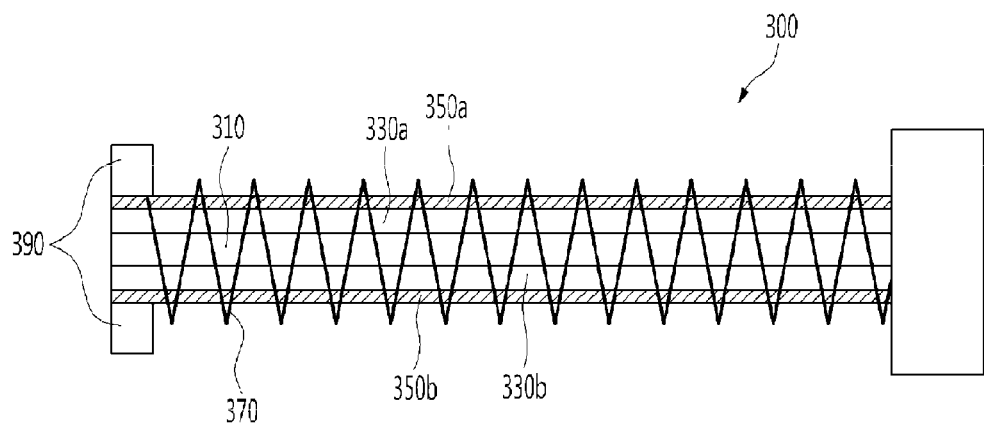
FIG. 3 illustrates a piezoelectric energy harvester according to an exemplary embodiment of the present invention.

FIG. 3 illustrates a piezoelectric energy harvester according to an exemplary embodiment of the present invention.

Referring to FIG. 3, a piezoelectric energy harvester 300 according to an exemplary embodiment of the present invention has the form of a cantilever and includes first and second piezoelectric layers 330a and 330b respectively formed on upper and lower surfaces of a shim 310, first and second magnetostrictive layers 350a and 350b respectively formed on the first and second piezoelectric layers 330a and 330b, and a coil 370 surrounding the first and second piezoelectric layers 330a and 330b and the first and second magnetostrictive layers 350a and 350b. In some cases, a proof mass 390 for compensating for a resonant frequency may be additionally included.

The shim 310 is intended to reinforce the stiffness of the first and second piezoelectric layers 330a and 330b. In the case of a bimorph structure in which a shim is connected in parallel with a piezoelectric layer in consideration of poling of the piezoelectric layer, the shim 310 is connected with a ground terminal, and its thickness and elastic modulus can be adjusted.

The first and second piezoelectric layers 330a and 330b are polarized in the thickness direction, and when vibration occurs, generate voltage due to the piezoelectric effect. The first and second piezoelectric layers 330a and 330b are connected with the positive (+) terminal of a bridge rectifier circuit.

Here, the first and second piezoelectric layers 330a and 330b may be formed of one of a piezoelectric ceramic material such as lead zirconate titanate (PZT), a piezoelectric single crystal material such as lead magnesium niobate-lead titanate (PMN-PT)/lead zinc niobate-lead titanate (PZN-PT), and a piezoelectric polymer such as polyvinylidene fluoride (PVDF).

The first and second magnetostrictive layers 350a and 350b are formed of a magnetostrictive material such as Terfenol-D and Metglas 2605SC vibrated to induce a change in magnetic field.

Such a magnetostrictive material is almost permanently magnetized by the magneto-mechanical effect when an external magnetic field is applied at a predetermined temperature.

Thus, when the first and second magnetostrictive layers 350a and 350b are in a bending motion, a change in magnetic field is induced, and current flows through the coil 370 surrounding the first and second magnetostrictive layers 350a and 350b according to Faraday's law, so that alternating current (AC) voltage is generated.

The generated AC voltage has the same phase as the displacement speed of a cantilever tip, and thus a switch of a power conditioning circuit (PCC) (not shown) can be driven according to detecting the displacement speed of the cantilever tip.

In other words, the piezoelectric energy harvester 300 according to an exemplary embodiment of the present invention can obtain primary voltage from the first and second piezoelectric layers 330a and 330b vibrated to generate voltage and secondary voltage from the first and second magnetostrictive layers 350a and 350b vibrated to induce a change in magnetic field and the coil 370 surrounding the first and second magnetostrictive layers 350a and 350b. Thus, it is possible to obtain sufficient voltage to drive a switch of the PCC without affecting the output characteristic of the piezoelectric energy harvester 300.

Also, the first and second magnetostrictive layers 350a and 350b and the coil 370 do not affect physical characteristics of the piezoelectric energy harvester 300. Thus, it is not necessary to consider a change in resonant frequency caused by an external voltage detector (not shown) and mechanical damping to design the piezoelectric energy harvester 300. And, a displacement sensor or a means for applying a magnetic field is not required, so that the piezoelectric energy harvester 300 can be miniaturized.

Meanwhile, a piezoelectric energy harvester having a cantilever structure has been described in this exemplary embodiment of the present invention, but a piezoelectric energy harvester having a single/multi-layer structure and a taper structure also can be implemented.

Figure 4A:
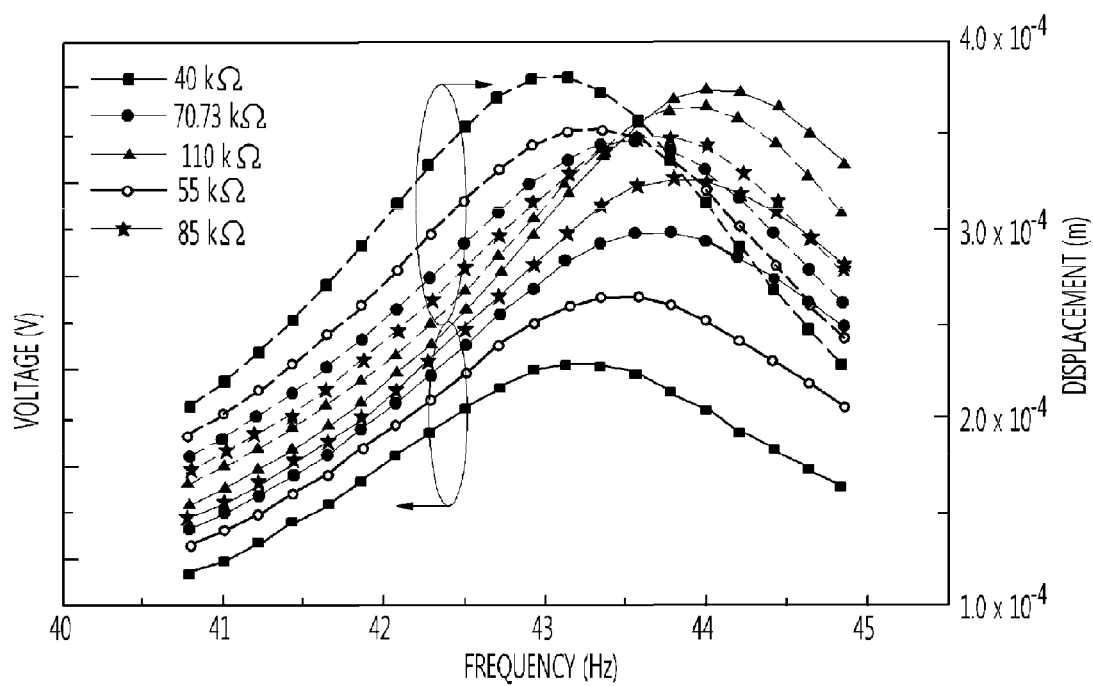

FIGS. 4A and 4B are graphs illustrating characteristics of displacement and output voltage of a piezoelectric energy harvester according to an exemplary embodiment of the present invention.

As illustrated in FIGS. 4A and 4B, a piezoelectric energy harvester can obtain a high voltage required to drive a switch of a PCC according to the displacement speed of a cantilever tip using the piezoelectric layers 330a and 330b and the magnetostrictive layers 350a and 350b without affecting an operating frequency.

According to an exemplary embodiment of the present invention, it is possible to implement a piezoelectric energy harvester of a simple structure capable of obtaining voltage required to drive a PCC without affecting characteristics thereof.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An apparatus, comprising:
a piezoelectric energy harvester; and
a power conditioning circuit (PCC) including a switch and configured to drive the switch to output a first voltage in accordance with displacement of the piezoelectric energy harvester, which is determined based on a second voltage,
wherein the piezoelectric energy harvester comprises:
a shim;
at least one piezoelectric layer configured to vibrate to generate the first voltage and formed over at least one of upper and lower surfaces of the shim;
at least one magnetostrictive layer configured to vibrate to induce a change in magnetic field and formed over the at least one piezoelectric layer; and
a coil configured to surround the piezoelectric layer and the magnetostrictive layer,
wherein, when the magnetostrictive layer vibrates and induces the change in magnetic field, a current flows through the coil to generate the second voltage, the second voltage being an AC voltage, and
wherein the first and second voltages are generated at substantially the same time due to the vibration.

2. The apparatus of claim 1, wherein the piezoelectric layer is formed of one of a piezoelectric ceramic material, a piezoelectric single crystal material, and a piezoelectric polymer.

3. The apparatus of claim 1, wherein the magnetostrictive layer is formed of Terfenol-D or Metglas 2605SC, which is a magnetostrictive material vibrating to induce the change in magnetic field.

4. A method of manufacturing an apparatus including a piezoelectric energy harvester and a power conditioning circuit (PCC), comprising:
providing a shim;
forming at least one piezoelectric layer over at least one upper and lower surfaces of the shim, the piezoelectric layer being configured to vibrate to generate a first voltage;
forming at least one magnetostrictive layer over the at least one piezoelectric layer, the magnetostrictive layer being configured to vibrate to induce a change in magnetic field;
surrounding the piezoelectric layer and the magnetostrictive layer with a coil to form the piezoelectric energy harvester, wherein, when the magnetostrictive layer vibrates, a current flows through the coil so that second voltage is generated, the second voltage being an AC voltage; and
providing the power conditioning circuit (PCC) that includes a switch and is configured to drive the switch to output the first voltage in accordance with displacement of the piezoelectric energy harvester, which is determined based on the second voltage,
wherein the first and second voltages are generates at substantially the same time due to the vibration.

5. The method of claim 4, wherein the piezoelectric layer is formed of one of a piezoelectric ceramic material, a piezoelectric single crystal material, and a piezoelectric polymer.

6. The method of claim 4, wherein the magnetostrictive layer is formed of Terfenol-D or Metglas 2605SC, which is a magnetostrictive material capable of vibrating to induce the change in magnetic field.

* * * * *